(12) United States Patent
Seo et al.

(10) Patent No.: US 12,738,302 B2
(45) Date of Patent: Sep. 15, 2026

(54) DECISION FEEDBACK EQUALIZER, AND MEMORY DEVICE AND MEMORY SYSTEM INCLUDING THE SAME

(71) Applicant: Samsung Electronics Co., Ltd., Suwon-si (KR)

(72) Inventors: Dongin Seo, Suwon-si (KR); Hyochang Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 18/955,883

(22) Filed: Nov. 21, 2024

(65) Prior Publication Data

US 2025/0210077 A1 Jun. 26, 2025

(30) Foreign Application Priority Data

Dec. 22, 2023 (KR) ........................ 10-2023-0190337

(51) Int. Cl.
*G11C 16/04* (2006.01)
*G11C 7/10* (2006.01)
*H04L 25/03* (2006.01)

(52) U.S. Cl.
CPC ...... *G11C 7/1048* (2013.01); *H04L 25/03057* (2013.01); *G11C 7/106* (2013.01)

(58) Field of Classification Search
CPC .............................. G11C 7/1048; G11C 7/106
See application file for complete search history.

(56) References Cited

U.S. PATENT DOCUMENTS 9,473,259 B2 10/2016 Levin et al.
9,722,820 B1 8/2017 Hekmat et al.
9,742,596 B2 8/2017 Goyal et al.
10,348,534 B1 7/2019 Sreeramaneni et al.
11,621,871 B2 4/2023 Lee et al.
2022/0014400 A1 1/2022 Hadar et al.
2023/0046702 A1 2/2023 Winterberg et al.
2024/0347102 A1* 10/2024 Waldrop ............ G11C 11/4093
2025/0061925 A1* 2/2025 Kasturi ............ H04L 25/03267
2026/0120748 A1* 4/2026 Subramanian ...... G11C 11/4076

FOREIGN PATENT DOCUMENTS

KR 10-2017-0109209 A 9/2017
KR 10-2178623 B1 11/2020

OTHER PUBLICATIONS

Baker, R. Jacob. CMOS: circuit design, layout, and simulation. A John Wiley & Sons, INC. Sep. 2010.

* cited by examiner

*Primary Examiner* — Pho M Luu
(74) *Attorney, Agent, or Firm* — Muir Patent Law, PLLC

(57) ABSTRACT

A decision feedback equalizer (DFE) includes an adder including a first node and a second node, and the adder configured to: receive an input signal, amplify a voltage difference between a reference voltage level and a voltage level of the input signal, and output a first internal signal from the first node and a second internal signal from the second node, a first DFE tap configured to provide a first tap bias current to one of the first node and the second node, based on a first sample signal corresponding to an immediately preceding bit of the input signal, and a tap bias voltage generation circuit configured to provide the first DFE tap with a first tap bias voltage corresponding to the first tap bias current, based on the DQ bias voltage, a tap code, and a temperature code depending on a temperature of the DFE.

20 Claims, 12 Drawing Sheets

120
206
COLUMN DECODER
200
MEMORY CELL ARRAY
(MCA)
208
I/O GATING CIRCUIT
BL
WL
204
WL DRIVER
202
ROW DECODER
270
OUTPUT
BUFFER
260
INPUT
BUFFER
DQ
280
TEMPERATRE
MONITORING
CIRCUIT
COL_ADDR
ROW_ADDR
CTRLS
VREF
230
ADDRESS
BUFFER
210
MRS
220
CONTROL
LOGIC
CIRCUIT
240
ODT CIRCUIT
250
VREF
GENERATION
CIRCUIT
ADDR
CMD
CLK

DECISION FEEDBACK EQUALIZER, AND MEMORY DEVICE AND MEMORY SYSTEM INCLUDING THE SAME

CROSS-REFERENCE TO RELATED APPLICATION(S)

This application is based on and claims priority under 35 U.S.C. § 119 to Korean Patent Application No. 10-2023-0190337, filed on Dec. 22, 2023, in the Korean Intellectual Property Office, the disclosure of which is incorporated by reference herein in its entirety.

BACKGROUND

The inventive concept relates to a decision feedback equalizer, and a memory device and a memory system including the decision feedback equalizer.

The processing speed of semiconductor systems is developing as the processing speed of semiconductors increases, but channel conditions are developing more slowly than the development of circuits. Therefore, when high-speed data is transmitted using channels, a loss may occur in the received data, and thus, technology to compensate for the loss may be essential. In general, decision feedback equalizers (DFEs) are effective circuits for compensating for this channel loss.

SUMMARY

The inventive concept provides a decision feedback equalizer (DFE) adjusting tap values according to a temperature, a memory device including the DFE, and a memory system.

According to an aspect of the inventive concept, there is provided a DFE including an adder including a first node and a second node, and the adder configured to: receive an input signal, amplify a voltage difference between a reference voltage level and a voltage level of the input signal based on a DQ bias voltage, and output a first internal signal from the first node line and a second internal signal from the second node, a first DFE tap configured to provide a first tap bias current to one of the first node and the second node, based on a first sample signal corresponding to an immediately preceding bit of the input signal, and a tap bias voltage generation circuit configured to provide the first DFE tap with a first tap bias voltage corresponding to the first tap bias current, based on the DQ bias voltage and a temperature code depending on a temperature of the DFE.

According to another aspect of the inventive concept, there is provided a memory device including a DFE configured to receive an input signal and output first and second internal signals. The DFE includes an adder including a first node and a second node, and the adder configured to: receive the input signal, amplify a voltage difference between a reference voltage level and a voltage level of the input signal based on a DQ bias voltage, and output the first internal signal from the first node line and a second internal signal from the second node line, a first DFE tap configured to provide a first tap bias current to one of the first node and the second node, based on a first sample signal corresponding to an immediately preceding bit of the input signal, and a tap bias voltage generation circuit configured to provide the first DFE tap with a first tap bias voltage corresponding to the first tap bias current, based on the DQ bias voltage and a temperature code depending on a temperature of the memory device.

According to another aspect of the inventive concept, there is provided a memory system including a memory controller and a memory device connected to the memory controller. The memory device includes a DFE configured to receive an input signal and output first and second internal signals, and the DFE includes an adder including a first node and a second node, and the adder configured to: receive the input signal, amplify a voltage difference between a reference voltage level and a voltage level of the input signal based on a DQ bias voltage, and output the first internal signal from the first node and a second internal signal from the second node, a first DFE tap configured to provide a first tap bias current to one of the first node and the second node, based on a first sample signal corresponding to an immediately preceding bit of the input signal, and a tap bias voltage generation circuit configured to provide the first DFE tap with a first tap bias voltage corresponding to the first tap bias current, based on the DQ bias voltage and a temperature code depending on a temperature of the memory system.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
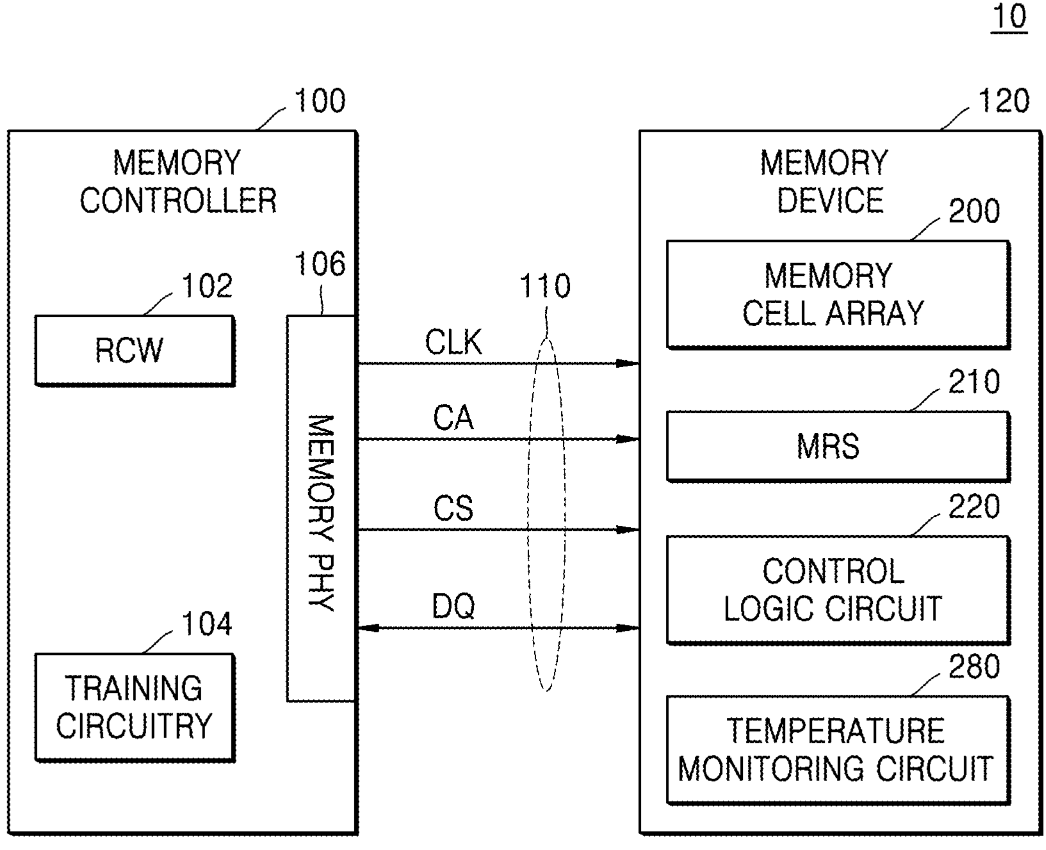
FIG. 1 is a block diagram showing a memory system including a memory device according to example embodiments.

FIG. 1 is a block diagram showing a memory system including a memory device according to example embodiments.

Referring to FIG. 1, a memory system 10 may include a memory controller 100 and a memory device 120. The memory system 10 may refer to a computing device, a virtual machine, or a virtual computing device thereof, such as integrated circuits, electronic devices or systems, smart phones, tablet PCs, computers, servers, workstations, portable communication terminals, personal digital assistants (PDAs), portable multimedia players (PMPs), and other suitable computers. Alternatively, the memory system 10 may refer to some of the components of a computing system, such as a graphics card. According to an embodiment, the memory system 10 may be provided as an unbuffered dual in-line memory module (UDIMM), a registered DIMM (RDIMM), a load reduced DIMM (LRDIMM), a fully buffered DIMM (FBDIMM), or a small outline DIMM (SODIMM).

The memory controller 100 may be communicatively connected to the memory device 120 through a memory bus 110. The memory controller 100 may include a register control word 102 (hereinafter, referred to as an 'RCW'), a training circuitry 104, and a memory physical layer (PHY) 106.

The RCW 102 may be provided to control the initialization and/or operation characteristics of the memory device 120. The RCW 102 may include various algorithms that configure the memory controller 100 so that the memory controller 100 may interact normally with the memory device 120. For example, codes representing the frequency, timing, driving, detailed operation parameters, or the like of the memory device 120 may be set in the RCW 102. Memory training of the memory device 120 may be performed according to the codes of the RCW 102.

The training circuitry 104 may perform, under the control of the memory controller 100, memory core parameter training associated with a memory core of the memory device 120 and/or peripheral circuit parameter training for other peripheral circuits excluding the memory core. The training circuitry 104 may determine optimal parameters for memory core parameters and/or peripheral circuit parameters of the memory device 120. As a main component of the memory controller 100, the training circuitry 104 may perform memory training of the memory device 120. In an embodiment, the training circuitry 104 is shown in the memory controller 100. However, as a main component of the memory device 120, a training circuitry 104 may be provided in the memory device 120 so as to perform memory training.

The memory PHY 106 may include a physical or electrical layer and a logical layer, which is provided for signals, frequency, timing, driving, detailed operation parameters, and functionality required for efficient communication between the memory controller 100 and the memory device 120. The memory PHY 106 may support features of double data rate (DDR) and/or low power DDR (LPDDR) protocols of the Joint Electron Device Engineering Council (JEDEC) standard.

The memory PHY 106 may connect the memory controller 100 and the memory device 120 to each other through the memory bus 110. For simplicity of the diagram, it is shown that a clock CLK, a command/address CA, or data DQ is provided via a single signal line between the memory controller 100 and the memory device 120. However, in practice, the clock CLK, the command/address CA, or the data DQ may be provided via a plurality of signal lines or buses. The signal lines between the memory controller 100 and the memory device 120 may be connected through connectors. The connectors may be provided as pins, balls, signal lines, or other hardware components.

A signal of the clock CLK may be transmitted from the memory controller 100 to the memory device 120 via a clock signal line of the memory bus 110. A signal of the command/address CA may be transmitted from the memory controller 100 to the memory device 120 via a command/address bus of the memory bus 110. A signal of chip selection CS may be transmitted from the memory controller 100 to the memory device 120 via a line of the chip selection CS of the memory bus 110. The data DQ may be transmitted from the memory controller 100 to the memory device 120 or from the memory device 120 to the memory controller 100, via a bus (or a DQ line) for the data DQ of the memory bus 110, which includes a bidirectional signal line.

The memory device 120 may write or read the data DQ under the control of the memory controller 100. The memory device 120 may include a memory cell array 200, a mode register set 210 (hereinafter, referred to as an 'MRS'), a control logic circuit 220, and a temperature monitoring circuit 280.

The memory cell array 200 may include a plurality of word lines, a plurality of bit lines, and a plurality of memory cells formed at the intersections of the word lines and bit lines. The memory cells of the memory cell array 200 may include volatile memory cells (e.g., dynamic random access memory (DRAM) cells, or static RAM (SRAM) cells), non-volatile memory cells (e.g., flash memory cells, resistive RAM (ReRAM) cells, phase change RAM (PRAM) cells, or magnetic RAM (MRAM) cell), or other types of memory cells.

The MRS 210 may be programmed to set a plurality of operation parameters, options, various functions, characteristics, and modes of the memory device 120. The MRS 210 may store a parameter code including appropriate bit values provided through a bus for the command/address CA of the memory bus 110, when an MRS command is issued from the memory controller 100.

For example, the MRS 210 may be used to control a burst length, read/write latency, a preamble/postamble length, write leveling enable/disable, decision feedback equalization (hereinafter, referred to as a 'DFE') quantity, pull-down/on die termination (ODT) and pull-up/output high level voltage (Voh) calibration, pre-emphasis, or reference voltage setting.

A burst length may be provided to set the maximum number of column locations accessible for read and/or write commands. The read/write latency may be provided to define a clock cycle delay between a read and/or write command and a first bit of valid output and/or input data. The write leveling may be provided to enable or disable skew compensation between a clock signal and a data strobe signal during a write operation.

The DFE quantity may be provided to subtract the remainder of bits of data DQ previously read so as to determine the current data bit. The pull-down/ODT and pull-up/output high level voltage (Voh) calibration may be provided to improve signal integrity (SI) by adjusting the swing widths and/or driving intensities of signals received through the bus for the command/address CA and/or the bus for the data DQ.

The pre-emphasis function may be provided to improve the SI by enlarging a data eye opening region of signals transmitted through the bus for the data DQ. The reference voltage setting may be provided to compare the logic value of the received signal with the voltage of the signal received from the command bus so as to read the logic value of the received signal.

The control logic circuit 220 may receive the signal of the clock CLK through the clock signal line of the memory bus 110 and control the operation timing of the memory device 120. The operation timing of the memory device 120 may be provided based on a signal provided to the memory device 120, for example, a strobe signal, in addition to the signal of the clock CLK. The control logic circuit 220 may receive a command received through the bus for the command/address CA and generate control signals to perform various memory operations within the memory device 120 in response to the command.

After the initialization and training operations are performed on the memory system 10 (i.e., while the memory device 120 is performing a normal operation), the temperature monitoring circuit 280 may provide calibration values according to temperature changes to a data input buffer 260 (in FIG. 2) so that the data transmitted to the memory device 120 has optimal SI and a data eye diagram according to temperature changes. For example, the temperature may be the temperature of a particular part of the memory device 120 or the temperature outside the memory device 120. For another example, the temperature may be the temperature of a particular part of the memory system 10 or the temperature outside the memory system 10.

Figure 2:
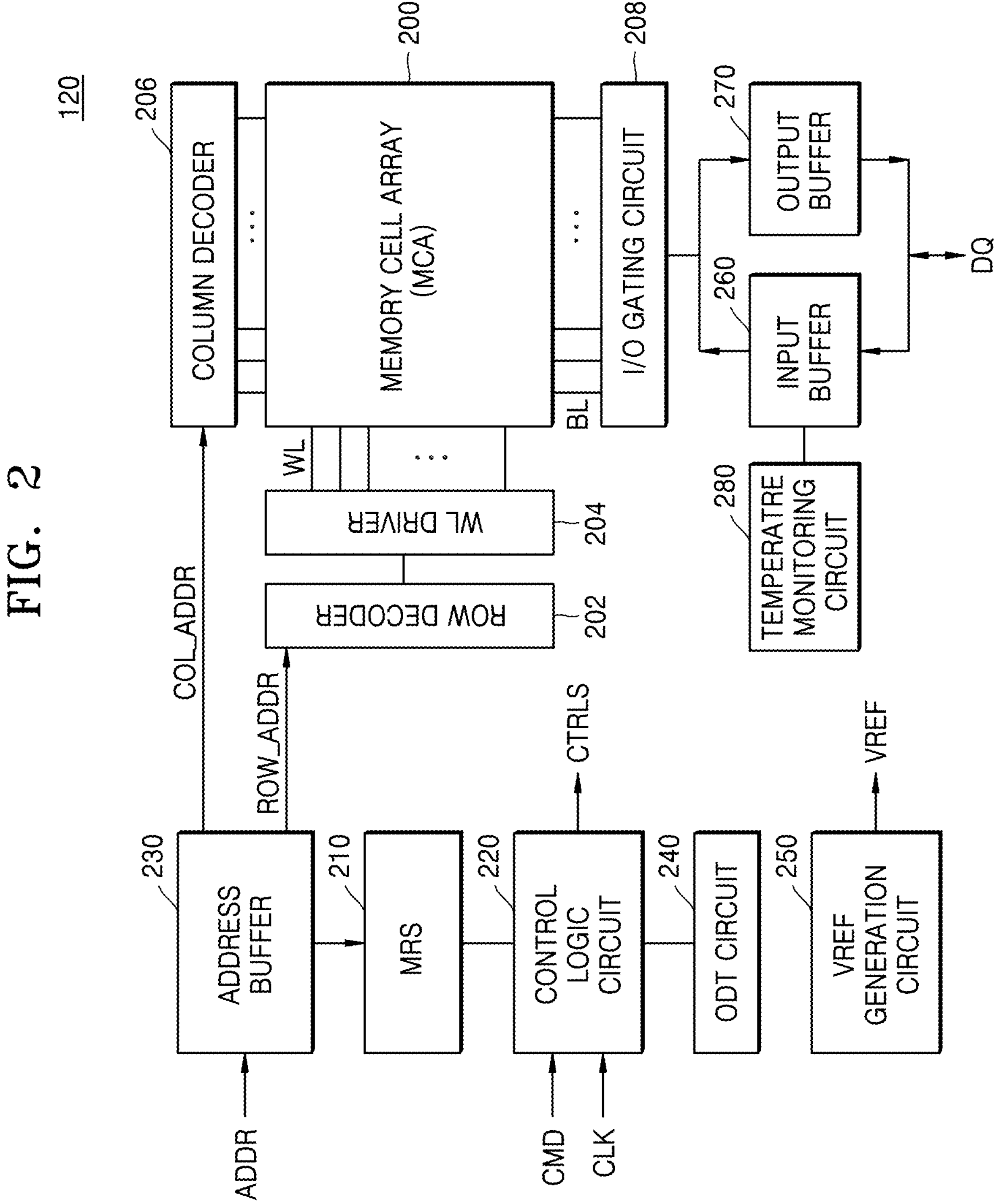
FIG. 2 is a block diagram showing a memory device according to example embodiments.

FIG. 2 is a block diagram showing the memory device 120 according to example embodiments.

Referring to FIGS. 1 and 2, the memory device 120 may include a memory cell array 200, a row decoder 202, a word line driver 204, a column decoder 206, an input/output gating circuit 208, an MRS 210, a control logic circuit 220, an address buffer 230, an ODT circuit 240, a reference voltage generation circuit 250, a data input buffer 260, a data output buffer 270, and a temperature monitoring circuit 280.

The memory cell array 200 includes a plurality of memory cells provided in a matrix form arranged in rows and columns. The memory cell array 200 includes a plurality of word lines WL and a plurality of bit lines BL connected to the memory cells. The plurality of word lines WL may be connected to rows of memory cells and the plurality of bit lines BL may be connected to columns of memory cells.

The row decoder 202 may select one of the plurality of word lines WL connected to the memory cell array 200. The row decoder 202 may decode a row address ROW_ADDR received from the address buffer 230 and select one word line corresponding to the row address ROW_ADDR and may connect the selected word line to the word line driver 204 that activates the selected word line. The column decoder 206 may select certain bit lines BL from among the plurality of bit lines BL of the memory cell array 200. The column decoder 206 may generate a column selection signal by decoding a column address COL_ADDR received from the address buffer 230 and may connect the bit lines BL selected by a column selection signal to the input/output gating circuit 208. The input/output gating circuit 208 may include read data latches for storing read data from the bit lines BL selected by the column selection signal and a write driver for writing write data in the memory cell array 200. The read data stored in the read data latches of the input/output gating circuit 208 may be provided to the bus for data DQ through the data output buffer 270. The write data may be applied to the memory cell array 200, through the data input buffer 260 connected to the bus for data DQ and through the write driver of the input/output gating circuit 208.

The control logic circuit 220 may receive signals of clock CLK and command CMD and generate control signals CTRLS that control the operation timing and/or memory operation of the memory device 120. The control logic circuit 220 may read data from the memory cell array 200 and write data in the memory cell array 200 using the control signals CTRLS.

In order to set operating conditions for the memory device 120, the MRS 210 may store information used by the control logic circuit 220 so that the operation of memory device 120 is configured. The MRS 210 may include registers that store parameter codes for various operating and control parameters used to set the operating conditions of the memory device 120. The parameter code may be received by the memory device 120 through the bus for command/address CA. The control logic circuit 220 provides the control signals CTRLS to circuits of the memory device 120 so that the circuits operate as set in the operating and control parameters stored by the MRS 210.

The ODT circuit 240 may provide termination resistance when enabled for the bus for command/address CA and/or the bus for data DQ. The termination resistance may improve the SI of signals received via the bus. The enablement of the ODT circuit 240 and the size of the termination resistance provided to the bus may be set by recording an appropriate parameter code on the MRS 210.

The reference voltage generation circuit 250 may provide a reference voltage VREF used by the circuits of the memory device 120. For example, the reference voltage VREF may be used by the control logic circuit 220 so that the logic value of the received signal is compared with the voltage of the signal received from the command bus so as to determine the logic value of the received signal. The range of the reference voltage VREF and/or the reference voltage VREF may be set by writing a reference voltage operation parameter code on the MRS 210.

The data input buffer 260 may provide the write data received via the bus for data DQ to the input/output gating circuit 208.

The data output buffer 270 may provide read data stored in the read data latches of the input/output gating circuit 208 to the memory controller 100 via the bus for data DQ.

After the initialization and training operations are performed on the memory system 10 (i.e., while the memory device 120 is performing a normal operation), the temperature monitoring circuit 280 may provide calibration values according to temperature changes to the data input buffer 260 so that the data transmitted to the memory device 120 has optimal SI and a data eye diagram according to temperature changes.

Figure 3A:
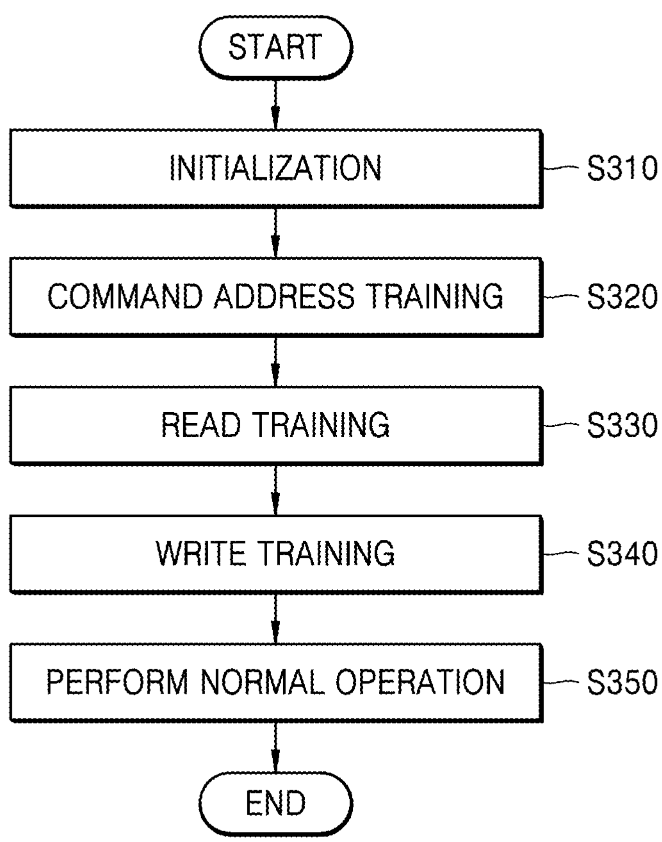
FIG. 3A is a flowchart showing an operation of the memory system of FIG. 1 according to example embodiments.
Figure 3B:
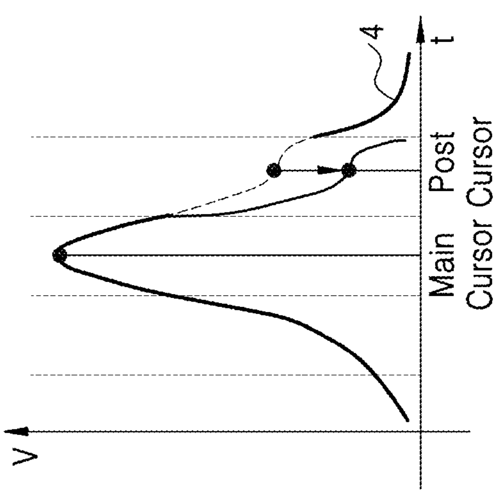
FIG. 3B is a diagram showing a comparative example.
Figure 3B:
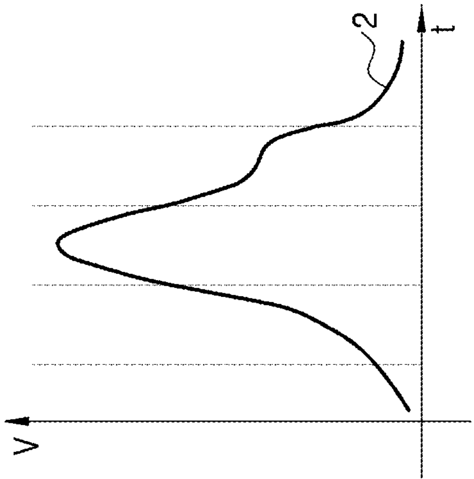

FIG. 3A is a flowchart showing an operation of the memory system of FIG. 1 according to example embodiments. FIG. 3B is a diagram showing a comparative example.

Referring to FIGS. 1, 2, and 3A, the memory system 10 may be initialized in operation S310. When the memory system 10 is powered up, the memory controller 100 and the memory device 120 may perform an initial setup operation according to a preset method. Default operation parameters may be set upon the initialization of the memory device 120.

In operation S320, the memory system 10 may perform a command address training operation. The memory controller 100 and the memory device 120 may perform the command address training operation to improve timing margins of the command CMD and address ADDR.

In operation S330, the memory system 10 may perform a read training operation. The memory controller 100 may adjust the operation parameter code of the memory device 120 so that the data read from the memory device 120 has the optimal SI and data eye diagram.

In operation S340, the memory system 10 may perform a write training operation. The memory controller 100 may transmit data to the memory device 120 and adjust the operation parameter code of the memory device 120 so that the transmitted data has the optimal SI and data eye diagram.

In operation S350, the memory system 10 may perform a normal operation after the initialization and training operation of operations S310 to S340 are performed.

Also, the initialization and training operation of operations S310 to S340 may be performed based on the temperature when the memory system 10 is powered up. Accordingly, when the temperature of the memory system 10 increases or decreases, the memory system 10 may not have optimal SI and data eye diagram.

In particular, tap values $C_1$ to $C_n$ (or referred to as first to n-th tap values $C_1$ to $C_n$) determined according to the DFE quantity (DFEQ) optimized for the input signal (e.g., the data DQ) include values determined based on the temperature when the memory system 10 is powered up. Therefore, it is necessary to adjust the first to n-th tap values $C_1$ to $C_n$ according to temperature changes.

Referring to FIG. 3B, it can be seen that the diagram shows a distorted input signal 2, a calibration signal 4 calibrated by the DFE at a training temperature, and a calibration signal 6 calibrated by the DFE at a temperature lower than the training temperature.

Comparing the calibration signal 4 with the calibration signal 6, it can be seen that a post cursor is less calibrated due to the temperature drop. For example, the first tap value $C_1$ may decrease as the temperature decreases.

Figure 6:
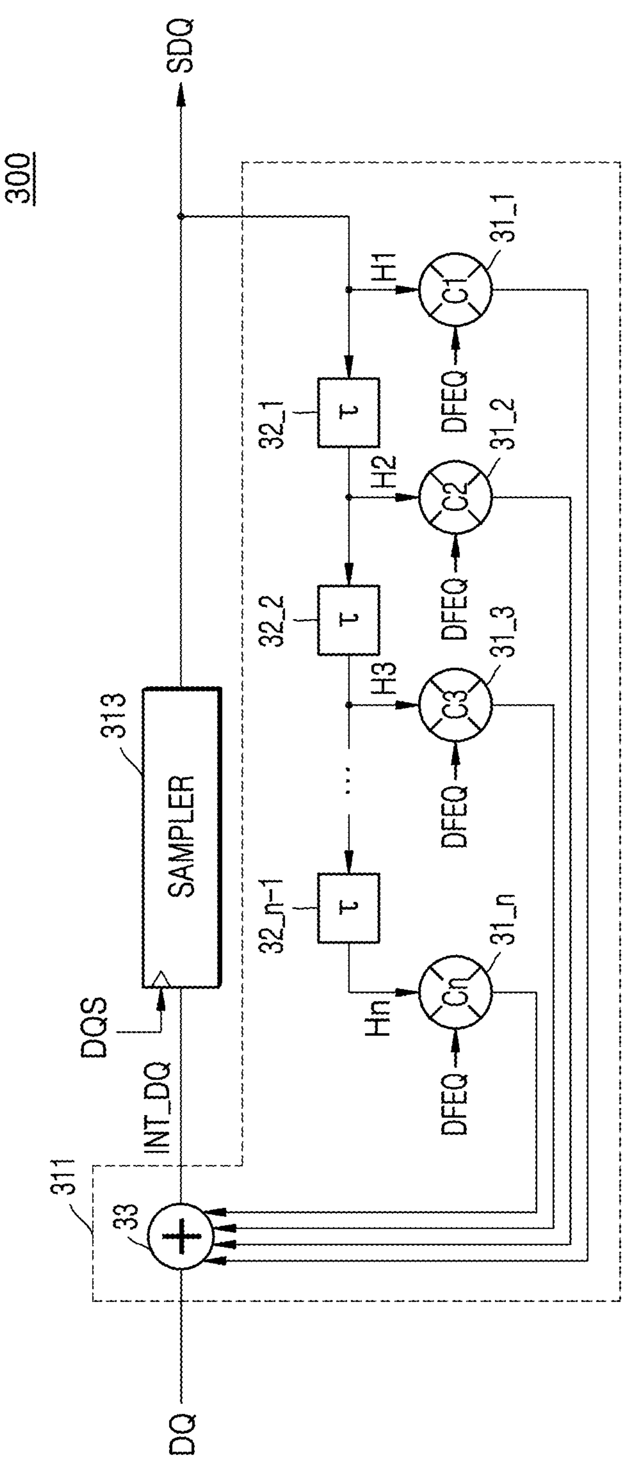
FIG. 6 is a diagram illustrating the DFE of FIG. 5 according to example embodiments.

This phenomenon occurs because the temperature coefficient for the gain of an adder 33 (FIG. 6) of the DFE is different from the temperature coefficient for the tap values $C_1$ to $C_n$ of DFE taps 31_1 to **31_*n* (FIG. 6**).

For example, as the temperature decreases, the gain of the adder 33 (FIG. 6) may increase, but the tap values $C_1$ to $C_n$ of the DFE taps 31_1 to **31_*n* (FIG. 6) may decrease. Accordingly, the post cursor may be further amplified by the adder 33 (FIG. 6) and the post cursor may be less calibrated by the DFE taps 31_1 to 31_*n* (FIG. 6**).

According to an embodiment, the memory system 10 is configured to adjust a bias voltage corresponding to the tap values $C_1$ to $C_n$ according to temperature changes, and thus, the transmitted data may have the optimal SI and data eye diagram despite the temperature changes.

Figure 4:
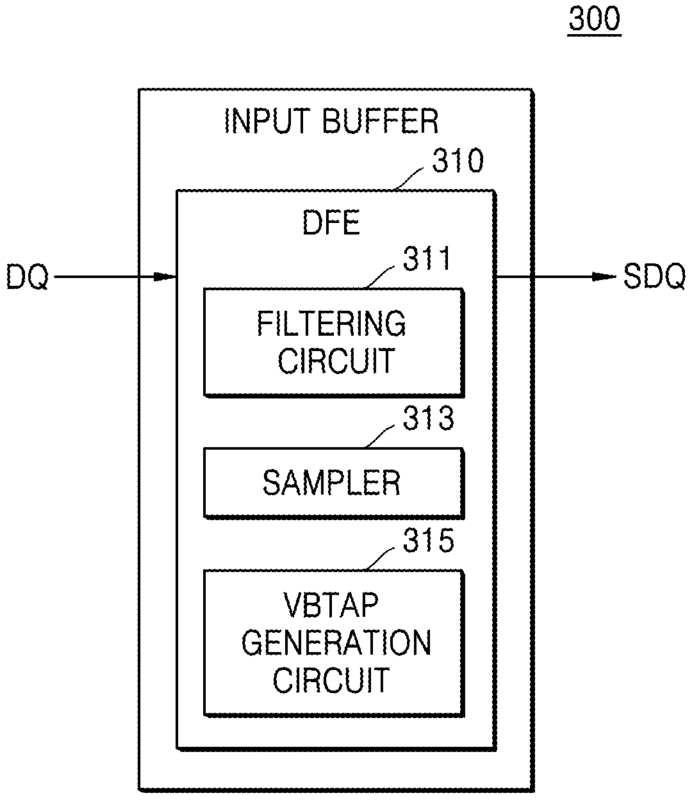
FIG. 4 is a block diagram showing an input buffer according to example embodiments.
Figure 5:
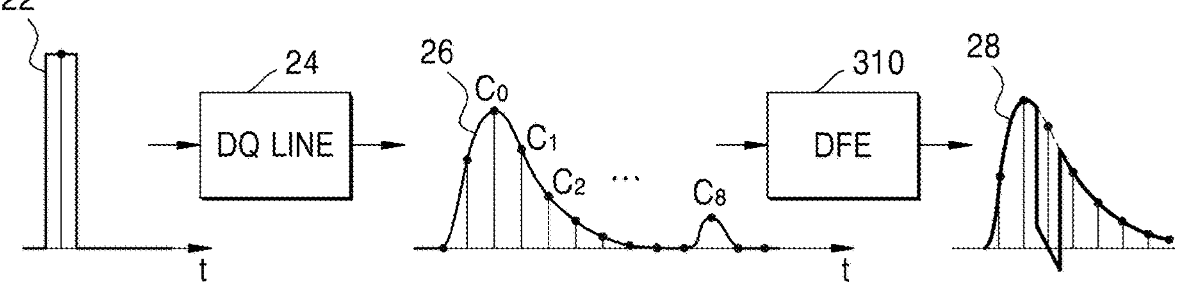
FIG. 5 is a diagram illustrating an effect of a decision feedback equalizer (DFE) of a data line according to example embodiments.

FIG. 4 is a block diagram showing an input buffer according to example embodiments. FIG. 5 is a diagram illustrating an effect of a DFE of a line of data DQ according to example embodiments. FIG. 6 is a diagram illustrating the DFE of FIG. 5 according to example embodiments.

Referring to FIG. 4, an input buffer 300 may include a DFE 310.

The DFE 310 may include a filtering circuit 311, a sampler 313, and a tap bias voltage generation circuit 315.

First, the filtering circuit 311 and the sampler 313 are described with reference to FIGS. 5 and 6.

Referring to FIG. 5, a DQ line 24 may experience signal loss and signal reflection. In the DQ line 24, inter-symbol interference (ISI) may cause one bit of data to interfere with subsequent bits and distort one bit of data (i.e., smear out and spill over).

One bit of a data signal 22 transmitted via the DQ line 24 may be received as a distorted signal 26 having a residue of a previous bit. The ISI may become more noticeable as data rates increase and the pulse widths representing data bits become correspondingly narrower. The value of the distorted signal 26 received at each sampling point may be referred to as a tap value, e.g., a main tap value $C_0$, a first tap value $C_1$, a second tap value $C_2$, or the like, which corresponds to the data signal 22 transmitted via the DQ line 24.

The DFE 310 may calibrate the distorted signal 26 received at each sampling point by subtracting the residual of the previous bit so as to determine the current bit and may thus generate a calibrated signal 28. FIG. 5 illustrates an example in which only the first tap value $C_1$ is calibrated by the DFE 310. However, this is only for convenience of description, and the embodiment is not limited thereto.

Hereinafter, the signal for the data DQ is referred to as an input signal DQ.

Referring to FIG. 6, the DFE 310 may include a filtering circuit 311 for calibrating the received input signal DQ and a sampler 313 for sampling the filtered input signal.

The filtering circuit 311 may include coefficient multipliers (or referred to as first to nth DFE taps) 31_1 to 31_n, delay units 32_1 to 32_(n−1), and an adder 33.

The first to nth DFE taps 31_1 to **31_*n* may multiply delayed sample signals H1 to Hn (or referred to as a delayed first to n th sample signals H1 to Hn) by tap values $C_1$ to $C_n$, respectively. The delayed sample signals H1 to Hn may be provided by the delay units 32_1 to 32_(n−1) that delay a sampled sample signal SDQ received from the sampler 313. In some embodiments, the delayed first sample signal H1 has already passed one cycle (or half cycle) of a write clock signal DQS and may be thus provided directly to the first DFE tap 31_1 without passing through the delay units 32_1 to 32_**(n−1).

The adder 33 may add or subtract the tap values $C_1$ to $C_n$ with respect to the input signal DQ before forwarding an internal signal INT_DQ calibrated by the filtering circuit 311 to the sampler 313.

The sampler 313 may sample the calibrated internal signal INT_DQ at a certain sample interval set by the write clock signal DQS and output the sampled sample signal SDQ.

The DFE taps 31_1 to **31_*n* may be provided with a DFE quantity (DFEQ) optimized for DQ data and determine the tap values $C_1$ to $C_n$ by multiplying the optimized DFEQ by the delayed sample signals H1 to Hn. The DFEQ may be provided from the MRS 210 (FIG. 2**).

The optimal DFEQ for the DQ line may be determined by the read training operation or write training operation respectively in operation S330 or operation S340 of FIG. 3A, and the information about the optimal DFEQ may be stored as a parameter code in the MRS 210.

Referring back to FIG. 4, the tap bias voltage generation circuit 315 may generate a tap bias voltage VBTAP. This is described in detail with reference to FIG. 7.

Figure 7:
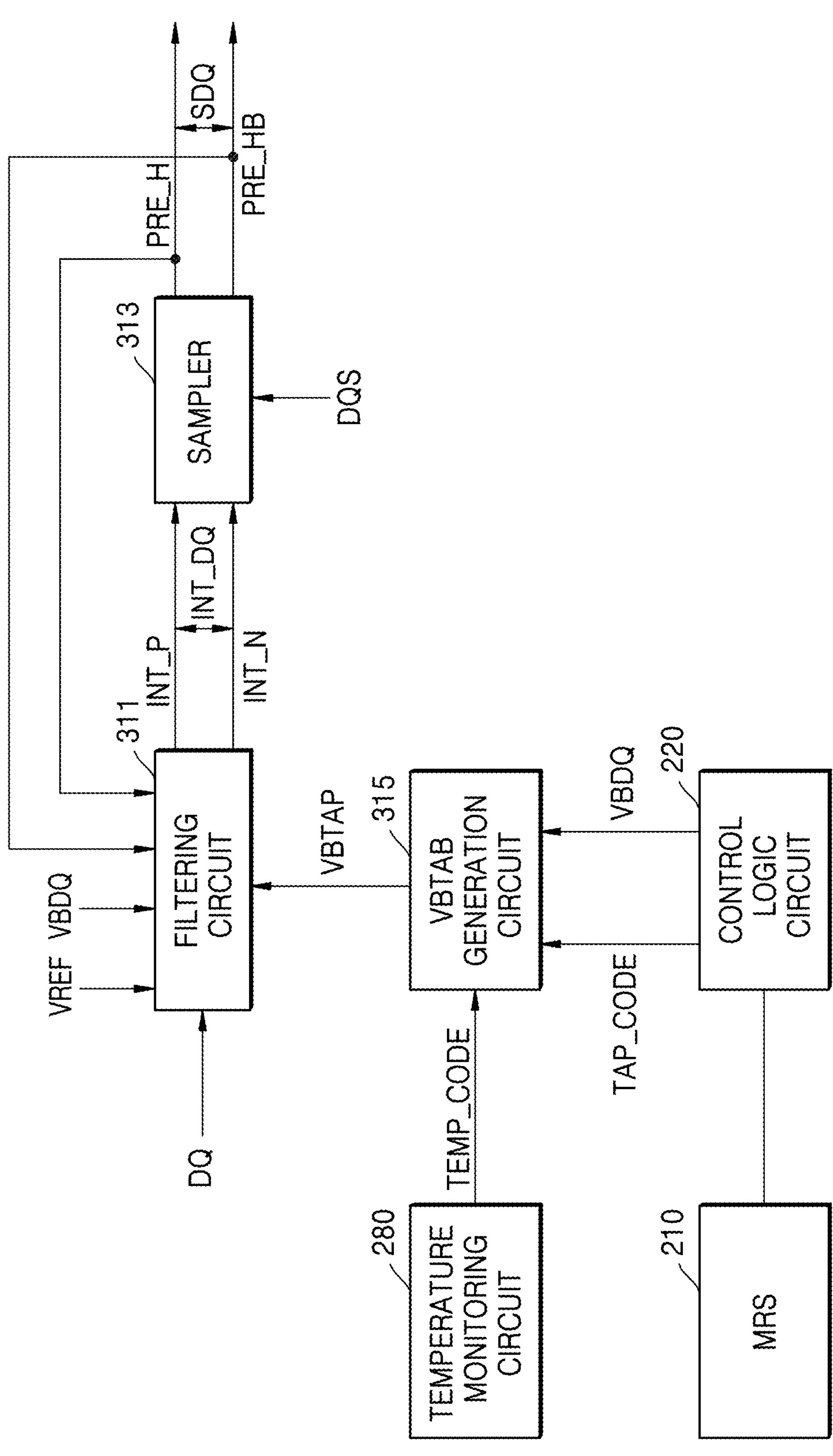
FIG. 7 is a diagram illustrating a tap bias voltage generation circuit of FIG. 4 according to example embodiments.

FIG. 7 is a diagram illustrating the tap bias voltage generation circuit 315 of FIG. 4 according to example embodiments.

Referring to FIG. 7, the tap bias voltage generation circuit 315 may provide the tap bias voltage VBTAP to the filtering circuit 311 on the basis of a DQ bias voltage VBDQ.

Here, the DQ bias voltage VBDQ represents the bias voltage required to drive the adder 33 (FIG. 6) of the filtering circuit 311, and the tap bias voltage VBTAP represents the bias voltage required to drive the DFE taps 31_1 to **31_*n* (FIG. 6) of the filtering circuit 311**.

Also, the tap bias voltage VBTAP may include a first tap bias voltage VBTAP1, a second tap bias voltage VBTAP2, a third tap bias voltage VBTAP3, . . . , and an nth tap bias voltage VBTAPn, and one tap bias voltage may correspond to one DFE tap.

For example, the first tap bias voltage VBTAP1 may correspond to the first DFE tap 31_1. For example, the first tap bias voltage VBTAP1 may include a bias voltage required to drive the first DFE tap 31_1 having the first tap value $C_1$.

Also, the DQ bias voltage VBDQ may be determined by the read training operation or write training operation respectively in operation S330 or operation S340 of FIG. 3A. For example, the tap bias voltage generation circuit 315 may provide the DQ bias voltage VBDQ determined through the training operation to the filtering circuit 311. In some embodiments, the control logic circuit 220 may provide the DQ bias voltage VBDQ to the filtering circuit 311 or the tap bias voltage generation circuit 315 on the basis of the parameter code stored in the MRS 210.

Also, the tap bias voltage VBTAP may be determined through the read training operation or write training operation respectively in operation S330 or operation S340 of FIG. 3A. Unlike the DQ bias voltage VBDQ, the tap bias voltage VBTAP may be redetermined according to temperature changes after the training operation.

For example, the tap bias voltage generation circuit 315 may provide the tap bias voltage VBTAP to the filtering circuit 311 on the basis of temperature changes after the training operation.

Due to the tap bias voltage VBTAP changed according to temperature changes, the tap values $C_1$ to $C_n$ may be different from the values determined in the training operation. Accordingly, the tap values $C_1$ to $C_n$ may be determined again according to temperature changes even after the training operation.

The tap bias voltage generation circuit 315 may output the tap bias voltage VBTAP on the basis of the DQ bias voltage VBDQ, a tap code TAP_CODE set in the training operation, and a temperature code TEMP_CODE depending on temperature.

Also, the temperature code TEMP_CODE may include a bit string of n-bits, and the temperature code TEMP_CODE may be provided from the temperature monitoring circuit 280.

In some embodiments, the temperature code TEMP_CODE may be expressed as a unary code. For example, the temperature code TEMP_CODE represents a value of 0 when expressed as 0000, the temperature code TEMP_CODE represents a value of 1 when expressed as 0001, the temperature code TEMP_CODE represents a value of 2 when expressed as 0011, the temperature code TEMP_CODE represents a value of 3 when expressed as 0111, and the temperature code TEMP_CODE represents a value of 4 when expressed as 1111. The 4-bit temperature code TEMP_CODE may express 0 to 4.

In some embodiments, the temperature code TEMP_CODE may be expressed as a unary code. For example, the temperature code TEMP_CODE represents a value of 0 when expressed as 0000, the temperature code TEMP_CODE represents a value of 1 when expressed as 1000, the temperature code TEMP_CODE represents a value of 2 when expressed as 1100, the temperature code TEMP_CODE represents a value of 3 when expressed as 1110, and the temperature code TEMP_CODE represents a value of 4 when expressed as 1111. The 4-bit temperature code TEMP_CODE may express 0 to 4.

Also, the tap code TAP_CODE may include a bit string of 6-bits, and the tap code TAP_CODE may be provided from the MRS 210. In some embodiments, the control logic circuit 220 may provide the tap code TAP_CODE to the tap bias voltage generation circuit 315 on the basis of the parameter code stored in the MRS 210.

Also, the tap code TAP_CODE may be expressed as a binary code. For example, the tap code TAP_CODE represents 0 when expressed as 000000, the tap code TAP_CODE represents 3 when expressed as 000011, and the tap code TAP_CODE represents 63 when expressed as 111111, the tap code TAP_CODE may express 0 to 63.

In some embodiments, the tap bias voltage generation circuit 315 may further include a decoder that converts a digital signal into an analog signal, and the tap bias voltage generation circuit 315 may provide the filtering circuit 311 with the tap bias voltage VBTAP based on the tap code TAP_CODE and the temperature code TEMP_CODE using the decoder.

Also, the filtering circuit 311 may amplify the difference between the voltage level of the input signal DQ and the voltage level of the reference voltage VREF to generate first and second internal signals INT_P and INT_N and may then provide the first and second internal signals INT_P and INT_N to the sampler 313. Here, the difference in voltage levels between the first and second internal signals INT_P and INT_N may correspond to the internal signal INT_DQ.

The sampler 313 may sample the first and second internal signals INT_P and INT_N using the write clock signal DQS and then output first and second sample signals PRE_H and PRE_HB. Also, the difference in voltage levels between the first and second sample signals PRE_H and PRE_HB may correspond to a sample signal SDQ. The sample signal SDQ may include a digital signal corresponding to the bits of the input signal DQ.

Also, the first and second internal signals INT_P and INT_N may be signals respectively calibrated by the first and second sample signals PRE_H and PRE_HB of the sampler 313. Also, the difference in voltage levels between the first and second sample signals PRE_H and PRE_HB may correspond to the delayed first sample signal H1.

Figure 8:
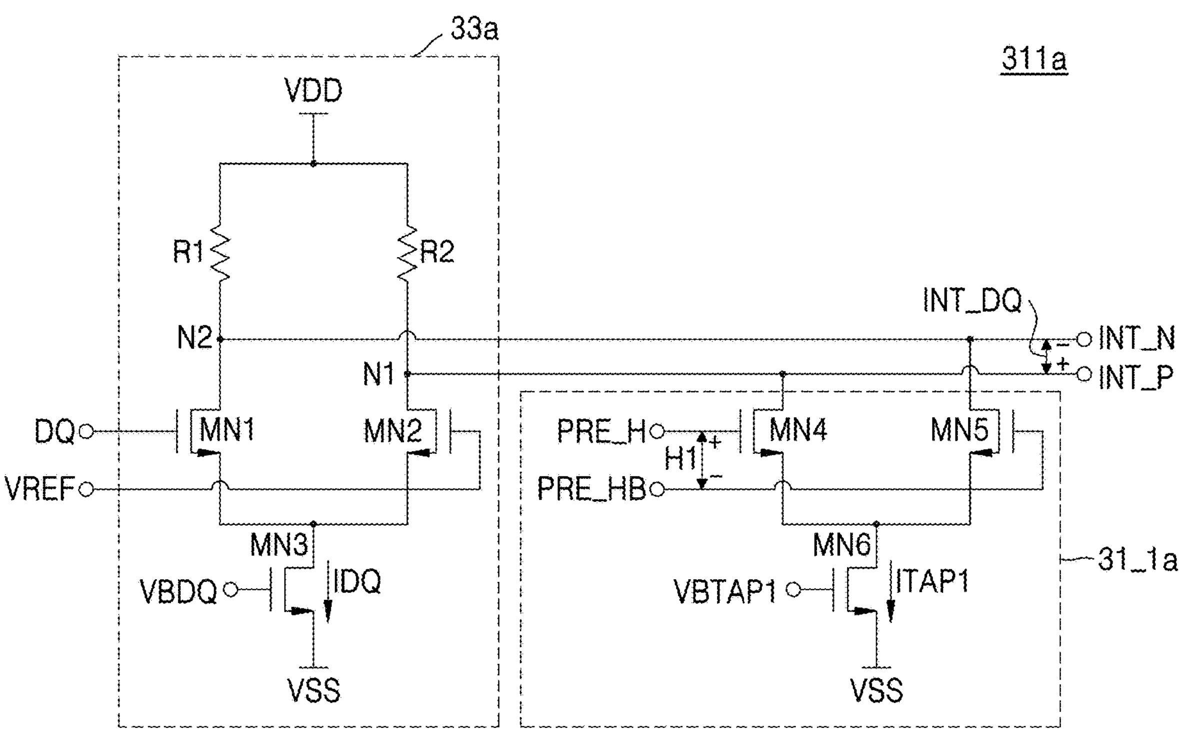
FIG. 8 is a diagram illustrating an equivalent circuit of a filtering circuit according to example embodiments.

FIG. 8 is a diagram illustrating an equivalent circuit of a filtering circuit 311*a* according to according to example embodiments. FIG. 8 illustrates an example in which the filtering circuit 311*a* includes only a first DFE tap 31_1*a*. However, this is only for convenience of description, and the embodiment is not limited thereto. For example, the filtering circuit 311*a* may include first to nth DFE taps 31_1*a* to 31_*na*.

Referring to FIG. 8, the filtering circuit 311*a* may include an adder 33*a* and the first DFE tap 31_1*a*.

Also, the adder 33*a* may amplify the difference between a voltage level of an input signal DQ and a voltage level of a reference voltage VREF to generate first and second internal signals INT_P and INT_N and may then provide the first and second internal signals INT_P and INT_N to the sampler 313 (FIG. 6). The difference between the voltage level of the first internal signal INT_P and the voltage level of the second internal signal INT_N may correspond to the calibrated internal signal INT_DQ described in FIG. 6.

The adder 33*a* may compare the voltage level of the input signal DQ to the voltage level of the reference voltage VREF, amplify the difference between the voltage level of the input signal DQ and the voltage level of the reference voltage VREF, and generate the first and second internal signals INT_P and INT_N in first and second nodes N1 and N2, respectively. The reference voltage VREF may be provided from the reference voltage generation circuit 250 (FIG. 2).

The adder 33*a* may include transistors MN1, MN2, and MN3 and resistors R1 and R2. The transistors MN1, MN2, and MN3 may be provided as n-type metal oxide semiconductor (NMOS) transistors.

A line of an input signal DQ may be connected to a gate terminal of the transistor MN1. A source terminal of the transistor MN1 may be connected to a drain terminal of the transistor MN3, and a drain terminal of the transistor MN1 may be connected to the resistor R1. The transistor MN1 may control the amount of current flowing between the drain terminal and the source terminal of the transistor MN1 according to the voltage level of the input signal DQ.

A line of the reference voltage VREF may be connected to a gate terminal of the transistor MN2. A source terminal of the transistor MN2 may be connected to the drain terminal of the transistor MN3, and a drain terminal of the transistor MN2 may be connected to the resistor R2.

The transistor MN3 may be referred to as a CS1 current source. The CS1 current source may provide a first bias current IDQ flowing through the transistors MN1 and MN2. A line of a DQ bias voltage VBDQ may be connected to a gate terminal of the transistor MN3. The drain terminal of the transistor MN3 may be connected to the source terminals of the transistors MN1 and MN2, and a source terminal of the transistor MN3 may be connected to a ground voltage VSS.

The resistor R1 may be connected between a power supply voltage VDD and the drain terminal of the transistor MN1. The resistor R2 may be connected between the power supply voltage VDD and the drain terminal of the transistor MN2. Each of the resistors R1 and R2 may be formed using a passive element or a transistor. The transistors MN1 and MN2 may have the same configuration, and the resistors R1 and R2 may also have the same configuration.

The adder 33*a* may include a current mode logic (CML) circuit. The first internal signal INT_P may be output from a first connection node N1 between the drain terminal of the transistor MN2 and the resistor R2, and the second internal signal INT_N may be output from a second connection node N2 between the drain terminal of the transistor MN1 and the resistor R1. In the adder 33*a*, the voltage levels, that is, swing levels, of the first and second internal signals INT_P and INT_N may be determined according to the difference between the voltage level of the input signal DQ and the voltage level of the reference voltage VREF.

The first DFE tap 31_1*a* may provide a second bias current ITAP1 to one of the line of the first internal signal INT_P and the line of the second internal signal INT_N on the basis of the delayed first sample signal H1 and may lower the level of the voltage, which is output from a line providing the second bias current ITAP1, by the first tap value $C_1$. Also, when R1=R2=RL, the first tap value $C_1$ may be RL*ITAP1.

Also, the delayed first sample signal H1 may represent the value of the data bit immediately preceding the current data bit of the input signal DQ, and the value indicated by the delayed first sample signal H1 may be "0" or "1". For example, when the delayed first sample signal H1 is sampled at a rising edge of the write clock signal DQS applied to the sampler 313 (FIG. 6), the current data bit (i.e., the sample signal SDQ) of the input signal DQ may be sampled at a next falling edge of the write clock signal DQS. Also, when the first sample signal H1 is sampled at a falling edge of the write clock signal DQS applied to the sampler 313 (FIG. 6), the current data bit (i.e., the sample signal SDQ) of the input signal DQ may be sampled at a next rising edge of the write clock signal DQS.

The first DFE tap 31_1*a* may include transistors MN4, MN5, and MN6. The transistors MN4, MN5, and MN6 may be provided as NMOS transistors.

A line of a first sample signal PRE_H may be connected to a gate terminal of the transistor MN4. A source terminal of the transistor MN4 may be connected to a drain terminal of the transistor MN6, and a drain terminal of the transistor MN4 may be connected to the line of the first internal signal INT_P. The transistor MN4 may control the amount of current flowing between the drain terminal and the source terminal of the transistor MN4 in response to the first sample signal PRE_H.

The line of an inverted second sample signal PRE_HB may be connected to a gate terminal of the transistor MN5. Also, the first sample signal PRE_H and the second sample signal PRE_HB may be in a differential relationship pair. In some embodiments, the second sample signal PRE_HB may correspond to the output of an inverter that receives the first sample signal PRE_H and outputs the second sample signal PRE_HB, and the inverter may be provided in the line of the first sample signal PRE_H.

A source terminal of the transistor MN5 may be connected to the drain terminal of the transistor MN6, and a drain terminal of the transistor MN5 may be connected to the line of the second internal signal INT_N. The transistor MN5 may control the amount of current flowing between the drain terminal and the source terminal of the transistor MN5 in response to the inverted second sample signal PRE_HB.

Also, the difference in voltage levels between the first and second sample signals PRE_H and PRE_HB may correspond to the delayed first sample signal H1.

If the value indicated by the first sample signal H1 is "1", the transistor MN4 may be configured such that current flows between the drain terminal and the source terminal of the transistor MN4, and the transistor MN5 may be configured such that no current flows between the drain terminal and the source terminal of the transistor MN5.

If the value indicated by the first sample signal H1 is "0", the transistor MN4 may be configured such that no current flows between the drain terminal and the source terminal of the transistor MN4, and the transistor MN5 may be configured such that current flows between the drain terminal and the source terminal of the transistor MN5.

The transistor MN6 may be referred to as a CS2 current source. The CS2 current source may provide the second bias current ITAP1 flowing through one of the transistors MN4 and MN5. The line of the first tap bias voltage VBTAP1 may be connected to a gate terminal of the transistor MN6. The drain terminal of the transistor MN6 may be connected to the source terminals of the transistors MN4 and MN5, and a source terminal of the transistor MN6 may be connected to a ground voltage VSS.

For example, if the value indicated by the first sample signal H1 is "1", the CS2 current source may provide the line of the first internal signal INT_P with the second bias current ITAP1 flowing through the transistor MN4. If the value indicated by the first sample signal H1 is "0", the CS2 current source may provide the line of the second internal signal INT_N with the second bias current ITAP1 flowing through the transistor MN5.

Figure 9:
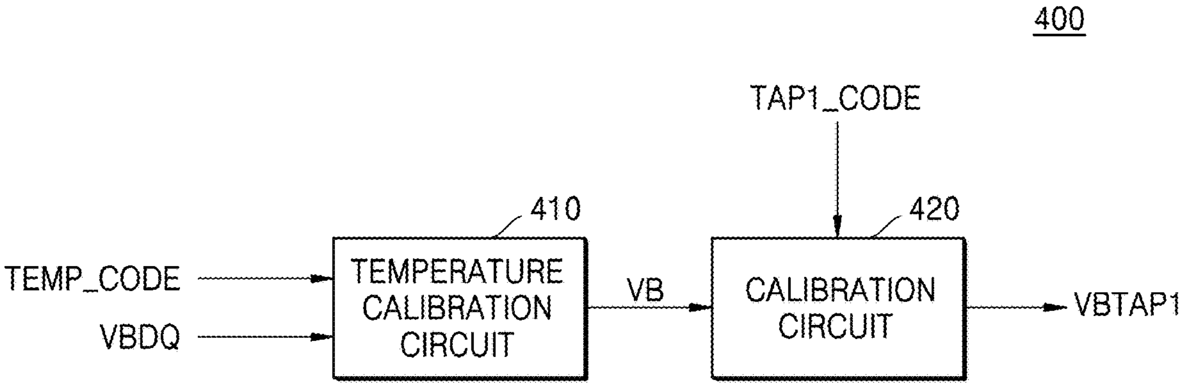
FIG. 9 is a diagram illustrating a tap bias voltage generation circuit according to example embodiments.

FIG. 9 is a diagram illustrating a tap bias voltage generation circuit 400 according to example embodiments. FIG. 9 illustrates the tap bias voltage generation circuit 400 that outputs the first tap bias voltage VBTAP1 provided to the first DFE tap 31_1*a* (FIG. 8), but the embodiment is not limited thereto. The tap bias voltage generation circuit 400 may output first to nth tap bias voltages VBTAP1 to VBTAPn by appropriately modifying the contents described below.

Referring to FIG. 9, the tap bias voltage generation circuit 400 may include a temperature calibration circuit 410 and a calibration circuit 420.

The temperature calibration circuit 410 may include a plurality of current paths (e.g., 411*a*, FIG. 10) turned on or off based on the temperature code TEMP_CODE and at least one current path (e.g., 413*a*, FIG. 10) connected to a ground voltage and continuously flowing a current. For example, the at least one current path may include a PMOS transistor having a gate terminal connected to the ground voltage such that a current may flow in the at least one current path.

Hereinafter, the current path provided in the temperature calibration circuit 410 and turned on or off based on the temperature code TEMP_CODE is referred to as an input current path. Also, the current path provided in the temperature calibration circuit 410, connected to the ground voltage, and continuously flowing current is referred to as a default current path. In an embodiment, the temperature calibration circuit 410 may include a plurality of default current paths.

Figure 10:
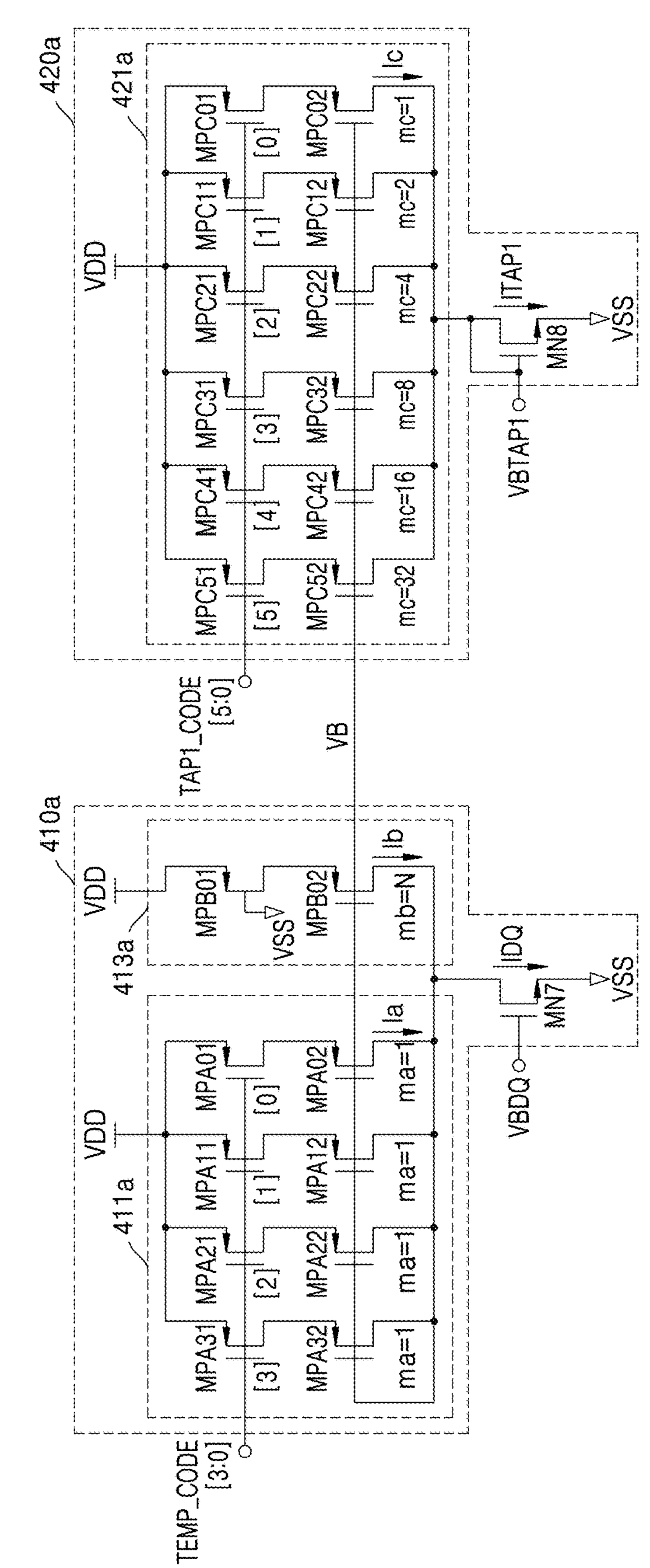
FIG. 10 is a diagram illustrating an equivalent circuit of a tap bias voltage generation circuit according to example embodiments.

In addition, the temperature calibration circuit 410 may further include an NMOS transistor MN7 (FIG. 10) that provides a DQ bias current IDQ (FIG. 10) flowing through the plurality of input current paths and at least one default current path. Also, the DQ bias current IDQ (FIG. 10) may be provided by the DQ bias voltage VBDQ that is applied to a gate terminal of the NMOS transistor MN7 (FIG. 10).

The gate terminal of the NMOS transistor MN7 (FIG. 10) that provides the DQ bias current IDQ (FIG. 10) may be connected to the line of the DQ bias voltage VBDQ. A source terminal of the NMOS transistor MN7 (FIG. 10) providing the DQ bias current IDQ (FIG. 10) may be connected to a ground voltage, and a drain terminal of the NMOS transistor MN7 (FIG. 10) providing the DQ bias current IDQ (FIG. 10) may be connected in parallel to the plurality of input current paths and at least one default current path.

In addition, the plurality of input current paths of the temperature calibration circuit 410 may include first PMOS transistors (e.g., MPA31, MPA21, MPA11, and MPA01 in FIG. 10) each having a gate terminal connected to the line of the temperature code TEMP_CODE and second PMOS transistors (e.g., MPA32, MPA22, MPA12, and MPA02 in FIG. 10) having gate terminals connected to the line of a bias voltage VB.

Also, source terminals of the first PMOS transistors may be connected to the power supply voltage, and a drain terminal of each of the first PMOS transistors may be connected to a corresponding source terminal of each of the second PMOS transistors.

In addition, drain terminals of the second PMOS transistors may be connected to the drain terminal of the NMOS transistor MN7 (FIG. 10) that provides the DQ bias current IDQ. Gate terminals of the second PMOS transistors may be connected to the drain terminals of the second PMOS transistors. That is, the second PMOS transistors may be provided as diode-connected transistors.

In addition, the at least one default current path of the temperature calibration circuit 410 may include a third PMOS transistor (e.g., MPB01 in FIG. 10) having a gate terminal connected to the ground voltage and a fourth PMOS transistor (e.g., MPB02 in FIG. 10) having a gate terminal connected to the line of the bias voltage VB.

Also, a source terminal of the third PMOS transistor may be connected to the power supply voltage, and a drain terminal of the third PMOS transistor may be connected to a source terminal of the fourth PMOS transistor.

A drain terminal of the fourth PMOS transistor may be connected to the drain terminal of the NMOS transistor MN7 that provides the DQ bias current. The gate terminal of the fourth PMOS transistor may be connected to the drain terminal of the fourth PMOS transistor. That is, each of the second PMOS transistors may be provided as a diode-connected transistor.

The temperature calibration circuit 410 may output the bias voltage VB on the basis of the DQ bias voltage VBDQ and the number of input current paths turned on. In an embodiment, the temperature calibration circuit 410 may provide the bias voltage VB to the calibration circuit 420.

The number of turned-on input current paths may correspond to the number of first PMOS transistors turned on in response to the temperature code TEMP_CODE among the first PMOS transistors in each of the plurality of input current paths. That is, depending on the turn-on or turn-off of the first PMOS transistors in the plurality of input current paths, the turn-on or turn-off of the corresponding input current path may be determined.

In addition, the drain terminals and gate terminals of the second PMOS transistors are connected to each other. Accordingly, depending on the magnitude of the current flowing in one input current path, the level of the voltage applied to the line of the bias voltage VB, to which the gate terminals of the second PMOS transistors are connected, may vary.

Similarly, the drain terminal and gate terminal of the fourth PMOS transistor are connected to each other. Accordingly, depending on the magnitude of the current flowing in one default current path, the level of the voltage applied to the line of the bias voltage VB, to which the gate terminal of the fourth PMOS transistor is connected, may vary.

Also, each of the first PMOS transistors, the second PMOS transistors, the third PMOS transistor, and the fourth PMOS transistor may have the same configuration. Therefore, the magnitude of the current (e.g., Ib of FIG. 10) flowing through one default current path may be the same as the magnitude of the current (e.g., la of FIG. 10) flowing through one input current path.

In addition, due to the NMOS transistor MN7 (FIG. 10) providing the DQ bias current IDQ (FIG. 10), the total magnitude of the current flowing through the turned-on input current paths and at least one default current path has to be equal to the magnitude of the DQ bias current IDQ (FIG. 10). Accordingly, the magnitude of the current flowing through each of the turned-on input current paths and at least one default current path may be equal to the value obtained by dividing the magnitude of the DQ bias current IDQ (FIG. 10) by the number of turned-on input current paths and default current path.

When the magnitude of the current (e.g., Ib of FIG. 10) flowing in one default current path is the same as the magnitude of the current (e.g., Ia of FIG. 10) flowing in one input current path, each of the second PMOS transistors and the fourth PMOS transistor may output the bias voltage VB through the shared line of the bias voltage VB depending on the magnitude of the same current flowing in each of the current paths.

For example, the temperature calibration circuit 410 may output the bias voltage VB to the calibration circuit 420 through the line of the bias voltage VB on the basis of the value obtained by dividing the magnitude of the DQ bias current IDQ (FIG. 10) by the number of turned-on input current paths and default current path. Also, the DQ bias current IDQ (FIG. 10) may be provided by the DQ bias voltage VBDQ that is applied to the gate terminal of the NMOS transistor MN7 (FIG. 10).

In an embodiment, the temperature calibration circuit 410 may include the NMOS transistor MN7 (FIG. 10) configured such that the DQ bias voltage VBDQ is applied to the gate terminal of the NMOS transistor MN7, the drain terminal of the NMOS transistor MN7 is connected in parallel to the plurality of input current paths and the at least one default current path, and the DQ bias current IDQ (FIG. 10) flows between the drain terminal and the source terminal of the NMOS transistor MN7. Each of the plurality of input current paths may include a corresponding PMOS transistor (e.g., one of the second PMOS transistors) configured such that the bias voltage VB is output through the gate terminal of the corresponding PMOS transistor, based on the magnitude of the current flowing between the drain terminal and the source terminal of the corresponding PMOS transistor. The magnitude of the DQ bias current IDQ (FIG. 10) may be obtained by adding the total magnitude of the currents flowing through all turned-on input current paths and the total magnitude of the currents flowing through all default current paths.

The calibration circuit 420 may include a plurality of current paths (e.g., 421*a* of FIG. 10) that are turned on or off on the basis of a first tap code TAP1_CODE. Hereinafter, the current path provided in the calibration circuit 420 and turned on or off based on the first tap code TAP1_CODE is referred to as an output current path.

Also, the calibration circuit 420 may further include an NMOS transistor MN8 (FIG. 10) that outputs the first tap bias voltage VBTAP1 on the basis of a first tap bias current ITAP1 (FIG. 10) flowing through the plurality of output current paths. Also, the first tap bias voltage VBTAP1 may be provided by the first tap bias current ITAP1 (FIG. 10) flowing between a drain terminal and a source terminal of the NMOS transistor MN8 (FIG. 10).

A gate terminal of the NMOS transistor MN8 (FIG. 10) providing the first tap bias voltage VBTAP1 may be connected to the line of the first tap bias voltage VBTAP1. In an embodiment, the NMOS transistor MN8 (FIG. 10) may provide the first tap bias voltage VBTAP1 to the first DFE tap 31_1*a* (FIG. 8).

In detail, the line of the first tap bias voltage VBTAP1 may be connected to the gate terminal of the transistor MN6 of the first DFE tap 31_1*a* (FIG. 8). If the transistor MN6 and the transistor MN8 have the same configuration, the transistor MN6 and the transistor MN8 may form a current mirror by sharing the first tap bias voltage VBTAP1 applied to the gate terminal thereof. For example, the currents flowing from the drain terminal to the source terminal of the transistor MN6 and the transistor MN8 may have the same magnitude.

In addition, the gate terminal of the NMOS transistor MN8 (FIG. 10) providing the first tap bias voltage VBTAP1 may be connected to the drain terminal of the NMOS transistor MN8 (FIG. 10) providing the first tap bias voltage VBTAP1. That is, the NMOS transistor MN8 (FIG. 10) may be provided as a diode-connected transistor.

Also, the source terminal of the NMOS transistor MN8 (FIG. 10) providing the first tap bias voltage VBTAP1 may be connected to the ground voltage, and the drain terminal of the NMOS transistor MN8 (FIG. 10) providing the first tap bias voltage VBTAP1 may be connected in parallel to the plurality of output current paths.

Also, each of the plurality of output current paths of the calibration circuit 420 may include fifth PMOS transistors (e.g., MPC51, MPC41, MPC31, MPC21, MPC11, and MPC01 in FIG. 10) each having a gate terminal connected to the line of the first tap code TAP1_CODE and sixth PMOS transistors (e.g., MPC52, MPC42, MPC32, MPC22, MPC12, and MPC02 in FIG. 10) having gate terminals connected to the line of the bias voltage VB.

Also, source terminals of the fifth PMOS transistors may be connected to the power supply voltage, and a drain terminal of each of the fifth PMOS transistors may be connected to a corresponding source terminal of each of the sixth PMOS transistors.

In addition, drain terminals of the sixth PMOS transistors may be connected to the drain terminal of the NMOS transistor MN8 (FIG. 10) that provides the first tap bias voltage VBTAP1. The gate terminals of the sixth PMOS transistors may be connected to the line of the bias voltage VB.

The calibration circuit 420 may output the first tap bias voltage VBTAP1 on the basis of the bias voltage VB and the number of output current paths turned on. In an embodiment, the calibration circuit 420 may provide the first tap bias voltage VBTAP1 to the first DFE tap 31_1*a* (FIG. 8).

The number of turned-on output current paths may correspond to the number of fifth PMOS transistors turned on in response to the first tap code TAP1_CODE among the fifth PMOS transistors in each of the plurality of output current paths. That is, depending on the turn-on or turn-off of the fifth PMOS transistors in the plurality of output current paths, the turn-on or turn-off of the corresponding output current path may be determined.

In addition, since the gate terminals of the sixth PMOS transistors in the plurality of output current paths are connected to the line of the bias voltage VB, the magnitude of the current flowing through the plurality of output current paths may be determined according to the bias voltage VB.

For example, the second PMOS transistors, the fourth PMOS transistor, and the sixth PMOS transistors may form a current mirror by sharing the bias voltage VB respectively applied to the gate terminals thereof. Also, the current (e.g., Ic of FIG. 10) flowing through one of the sixth PMOS transistors may be determined by the current (e.g., la of FIG. 10) flowing through one of the second PMOS transistors or the current (e.g., Ib of FIG. 10) flowing through the fourth PMOS transistor.

Here, each of the first to sixth PMOS transistors may have the same configuration. Therefore, the magnitude of the current (e.g., Ic of FIG. 10) flowing in one output current path may be the same as the magnitude of the current (e.g., Ib of FIG. 10) flowing in one default current path or the magnitude of the current (e.g., Ia of FIG. 10) flowing in one input current path.

In addition, since the plurality of output current paths and the NMOS transistor MN8 (FIG. 10) are connected in parallel to each other, the magnitude of the first tap bias current ITAP1 (FIG. 10) flowing between the drain terminal and the source terminal of the NMOS transistor MN8 (FIG. 10) has to be equal to the total magnitude of the currents flowing through the output current paths. Therefore, the magnitude of the first tap bias current ITAP1 (FIG. 10) may be equal to the value obtained by multiplying the magnitude of the current flowing in one turned-on output current path by the number of turned-on output current paths.

For example, the calibration circuit 420 may output the first tap bias voltage VBTAP1 on the basis of the value obtained by multiplying the magnitude of the current flowing in one turned-on output current path by the number of turned-on output current paths. Also, the first tap bias voltage VBTAP1 may be determined by the first tap bias current ITAP1 (FIG. 10) flowing between the drain terminal and the source terminal of the NMOS transistor MN8 (FIG. 10).

In an embodiment, the calibration circuit 420 may further include the NMOS transistor MN8 (FIG. 10) configured such that the drain terminal of the NMOS transistor MN8 is connected in parallel to the plurality of output current paths, the first tap bias current ITAP1 (FIG. 10) flows between the drain terminal and the source terminal of the NMOS transistor MN8, and the first tap bias voltage VBTAP1 is output through the gate terminal of the NMOS transistor MN8. Each of the plurality of output current paths may include a corresponding PMOS transistor (e.g., one of the sixth PMOS transistors) providing the current flowing between the drain terminal and the source terminal of the corresponding PMOS transistor based on the bias voltage VB. The magnitude of the first tap bias current ITAP1 may be equal to the total magnitude of the currents flowing through all turned-on output current paths.

Also, when each of the first to sixth PMOS transistors have the same configuration, the magnitude of the first tap bias current ITAP1 (FIG. 10) and the magnitude of the DQ bias current IDQ (FIG. 10) may have a relationship as shown in Equation 1 below.

$$ITAP1 = \frac{C}{A+B} * IDQ \quad \text{[Equation 1]}$$

In Equation 1, where ITAP1 represents the magnitude of the first tap bias current, IDQ represents the magnitude of the DQ bias current, A represents the number of turned-on input current paths, B represents the number of default current paths, and C represents the number of turned-on output current paths.

FIG. 10 is a diagram illustrating an equivalent circuit of a tap bias voltage generation circuit according to example embodiments. Hereinafter, descriptions may be made with reference to FIG. 9, and repeated descriptions thereof are omitted.

A tap bias voltage generation circuit 400*a* may include a temperature calibration circuit 410*a* and a calibration circuit 420*a*.

The temperature calibration circuit 410*a* may include a plurality of input current paths 411*a* turned on or off on the basis of the temperature code TEMP_CODE[3:0] and at least one current path 413*a* and an NMOS transistor MN7 which are connected to the ground voltage VSS and continuously flowing current.

The calibration circuit 420*a* may include a plurality of output current paths 421*a* and an NMOS transistor MN8, which are turned on or off on the basis of the first tap code TAP1_CODE.

The plurality of input current paths 411*a* of the temperature calibration circuit 410*a* may include first PMOS transistors (e.g., MPA31, MPA21, MPA11, and MPA01) each having a gate terminal connected to the line of the temperature code TEMP_CODE[3:0] and second PMOS transistors (e.g., MPA32, MPA22, MPA12, and MPA02) having gate terminals connected to the line of a bias voltage VB.

The at least one default current path 413*a* of the temperature calibration circuit 410*a* may include a third PMOS transistor MPB01 having a gate terminal connected to the ground voltage and a fourth PMOS transistor MPB02 having a gate terminal connected to the line of the bias voltage VB.

The plurality of output current paths of the calibration circuit 420*a* may include fifth PMOS transistors (e.g., MPC51, MPC41, MPC31, MPC21, MPC11, and MPC01) each having a gate terminal connected to the line of a first tap code TAP1_CODE[5:0] and sixth PMOS transistors (e.g., MPC52, MPC42, MPC32, MPC22, MPC12, and MPC02) having gate terminals connected to the line of the bias voltage VB.

Referring to FIG. 10, the plurality of input current paths 411*a* may be configured such that the number of the plurality of input current paths 411*a* corresponds to the number of values that may be expressed by the temperature code TEMP_CODE[3:0]. For example, the number of the plurality of input current paths 411*a* may be obtained by subtracting 1 from the number of values that may be expressed by the temperature code TEMP_CODE[3:0].

Also, the temperature code TEMP_CODE[3:0] may include a bit string of 4-bits, and the temperature code TEMP_CODE[3:0] may be provided from the temperature monitoring circuit 280. Also, the temperature code TEMP_CODE[3:0] may be expressed as a unary code.

For example, the temperature code TEMP_CODE[3:0] represents a value of 0 when expressed as 0000, the temperature code TEMP_CODE[3:0] represents a value of 1 when expressed as 0001, the temperature code TEMP_CODE[3:0] represents a value of 2 when expressed as 0011, the temperature code TEMP_CODE[3:0] represents a value of 3 when expressed as 0111, and the temperature code TEMP_CODE[3:0] represents a value of 4 when expressed as 1111. The temperature code TEMP_CODE[3:0] may express 0 to 4.

For example, when the temperature code TEMP_CODE [3:0] includes a 4-bit unary code, the number of input current paths 411*a* may be 4.

Also, referring to FIG. 10, ma may represent the number of input current paths that are assigned to each bit of the temperature code TEMP_CODE[3:0].

For example, since ma=1, there is one zeroth input current path that turns on or off in response to the bit value of a zeroth bit ([0]) of the temperature code TEMP_CODE[3:0]. Also, since ma=1, there is one first input current path that turns on or off in response to the bit value of a first bit ([1]) of the temperature code TEMP_CODE[3:0]. Also, since ma=1, there is one second input current path that turns on or off in response to the bit value of a second bit ([2]) of the temperature code TEMP_CODE[3:0]. Also, since ma=1, there is one third input current path that turns on or off in response to the bit value of a third bit ([3]) of the temperature code TEMP_CODE[3:0].

Here, the first PMOS transistor in each of the plurality of input current paths may be configured to turn on when the bit value is 0.

In an embodiment, the temperature code TEMP_CODE [3:0] may be expressed as a unary code, and the temperature calibration circuit 410*a* may be configured to turn on the plurality of input current paths 411*a* as many as the number of 0s expressed in the temperature code TEMP_CODE[3:0].

In an embodiment, the temperature calibration circuit 410*a* may be configured such that the number of turned-on input current paths increases by 1 as the value of the temperature code TEMP_CODE[3:0] decreases by 1.

Referring to FIG. 10, mb may represent the number of default current paths 413*a* in at least one default current path 413*a*. That is, although only one default current path is shown in FIG. 10, N default current paths may be provided according to an embodiment.

Referring to FIG. 10, the plurality of output current paths 421*a* may be configured such that the number of the plurality of output current paths 421*a* corresponds to the number of values that may be expressed by the first tap code TAP1_CODE[5:0]. That is, the number of the plurality of output current paths 421*a* may be obtained by subtracting 1 from the number of values that may be expressed by the first tap code TAP1_CODE[5:0].

Also, the first tap code TAP1_CODE[5:0] may include a bit string of 6-bits, and the first tap code TAP1_CODE[5:0] may be provided from the MRS 210. Also, the first tap code TAP1_CODE[5:0] may be expressed as a binary code.

For example, the first tap code TAP1_CODE[5:0] represents 0 when expressed as 000000, the first tap code TAP1_CODE[5:0] represents 3 when expressed as 000011, and the first tap code TAP1_CODE[5:0] represents 63 when expressed as 111111. The first tap code TAP1_CODE[5:0] may express 0 to 63.

That is, when the first tap code TAP1_CODE[5:0] includes a 6-bit binary code, the number of output current paths 421*a* may be 63.

Also, referring to FIG. 10, mc may represent the number of output current paths that are assigned to each bit of the first tap code TAP1_CODE[5:0]. That is, for convenience of description, only one output current path is shown for each bit of the first tap code TAP1_CODE[5:0] in FIG. 10, but different numbers of output current paths may be provided for each bit of the first tap code TAP1_CODE[5:0].

For example, since mc=1, there is one zeroth output current path that turns on or off in response to the bit value of a zeroth bit ([0]) of the first tap code TAP1_CODE[5:0]. Also, since mc=2, there are two first output current paths that turn on or off in response to the bit value of a first bit ([1]) of the first tap code TAP1_CODE[5:0]. Also, since mc=4, there are four second output current paths that turn on or off in response to the bit value of a second bit ([2]) of the first tap code TAP1_CODE[5:0]. Also, since mc=8, there are eight third output current paths that turn on or off in response to the bit value of a third bit ([3]) of the first tap code TAP1_CODE[5:0]. Also, since mc=16, there are 16 fourth output current paths that turn on or off in response to the bit value of a fourth bit ([4]) of the first tap code TAP1_CODE [5:0]. Also, since mc=32, there are 32 fifth output current paths that turn on or off in response to the bit value of a fifth bit ([5]) of the first tap code TAP1_CODE[5:0].

Here, the fifth PMOS transistor in each of the plurality of output current paths may be configured to turn on when the bit value is 0.

Also, when each of the first to sixth PMOS transistors may have the same configuration, the magnitude of the first tap bias current ITAP1 and the magnitude of the DQ bias current IDQ may have a relationship as shown in Equation 1 above. A relationship between the magnitude of the first tap bias current ITAP1 according to the temperature code and the first tap code and the magnitude of the DQ bias current IDQ is described below.

The temperature monitoring circuit 280 (FIG. 7) may generate the temperature code TEMP_CODE[3:0] such that the value of the temperature code TEMP_CODE[3:0] decreases as the temperature increases.

When the temperature code TEMP_CODE[3:0] is 1100 and the first tap code TAP1_CODE[5:0] is 111100, the relationship of ITAP1=3/(2+N)*IDQ is established. In detail, this is because the temperature calibration circuit 410*a* may have current paths of 2 (the number of turned-on input current paths)+N (the number of default current paths), and the calibration circuit 420 may have current paths of 3 (the number of zeroth output current paths+the number of first output current paths).

When the temperature code TEMP_CODE[3:0] is 0000 and the first tap code TAP1_CODE[5:0] is 111100, the relationship of ITAP1=3/(4+N)*IDQ is established. In detail, this is because the temperature calibration circuit 410*a* may have current paths of 4 (the number of turned-on input current paths)+N (the number of default current paths), and the calibration circuit 420 may have current paths of 3 (the number of zeroth output current paths+the number of first output current paths).

For example, as the temperature rises, the value of the temperature code TEMP_CODE[3:0] may decrease. Accordingly, the magnitude of the first tap bias current ITAP1 may be reduced.

As the magnitude of the first tap bias current ITAP1 decreases, the first tap value $C_1$, which is RL*ITAP1, may decrease.

Accordingly, as the temperature rises, the first tap value $C_1$ may be reduced by the temperature calibration circuit 410*a*.

Figure 11:
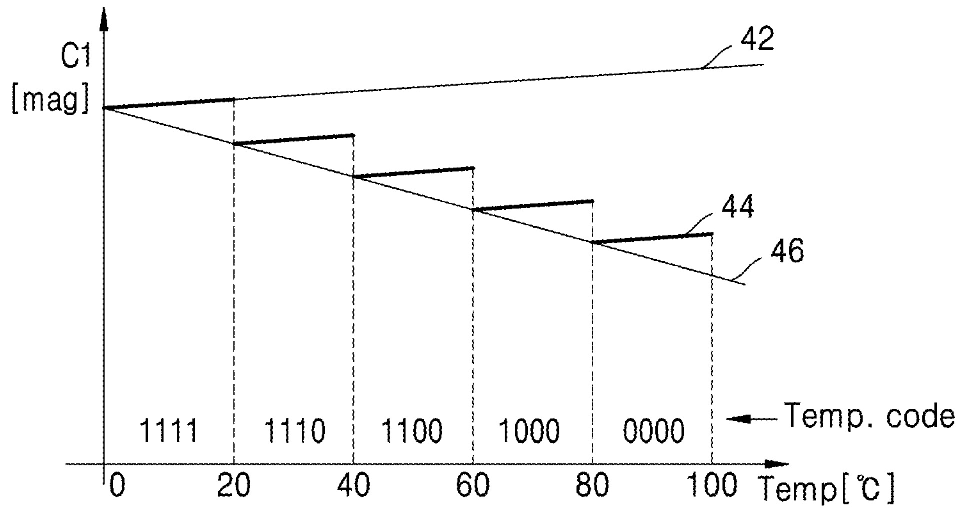
FIG. 11 is a diagram illustrating an effect of a DFE including a temperature calibration circuit according to example embodiments.

FIG. 11 is a diagram illustrating an effect of a DFE including a temperature calibration circuit according to example embodiments.

Referring to FIG. 11, it can be seen that a first tap value 42 depending on temperature, a first tap value 44 calibrated by the temperature calibration circuit 410 (FIG. 10), and a gain 46 of the adder 33 (FIG. 6) depending on temperature are illustrated.

When comparing the first tap value 42 depending on a temperature to the gain 46 of the adder 33 (FIG. 6) depending on the temperature, it can be seen that the temperature coefficient for the gain of the adder 33 (FIG. 6) is different from the temperature coefficient for the first tap value $C_1$ of the first DFE tap 31_1 (FIG. 6).

For example, the temperature coefficient for the gain of the adder 33 (FIG. 6) may have a negative temperature coefficient (NTC) and the temperature coefficient for the first tap value $C_1$ of the first DFE tap 31_1 (FIG. 6) may have a positive temperature coefficient (PTC).

According to the example embodiments, the temperature code TEMP_CODE[3:0] is provided as described above, and thus, the DFE including the temperature calibration circuit 410 (FIG. 10) may adjust the first tap value $C_1$ of the first DFE tap 31_1 (FIG. 6) according to temperature ranges.

Referring to FIG. 11, at the first tap value 44 calibrated by the temperature calibration circuit 410 (FIG. 10), it can be seen that the temperature range from about 0 degrees to about 100 degrees is divided into five temperature ranges, and each range is matched with the value of the temperature code TEMP_CODE[3:0].

Accordingly, the amount of change in the first tap value $C_1$ of the first DFE tap 31_1 (FIG. 6) according to a temperature of the memory device 120 or the memory system 10 may be equal to the amount of change in gain of the adder 33 (FIG. 6) according to the temperature.

For example, when the temperature changes from about 0 degrees Celsius to about 20 degrees Celsius, the amount of change in the first tap value $C_1$ of the first DFE tap 31_1 (FIG. 6) may be equal to the amount of change in the gain of the adder 33 (FIG. 6) by the temperature code TEMP-_CODE[3:0] having 1110.

For example, according to the example embodiments, even after the initialization and training of the memory system, the tap values $C_1$ to $C_n$ may be adjusted according to the temperature changes. Therefore, the transmitted data may have the optimal SI and data eye diagram.

While the invention has been particularly shown and described with reference to embodiments thereof, it will be understood that various changes in form and details may be made therein without departing from the spirit and scope of the invention as set forth in the following claims.

What is claimed is:

1. A decision feedback equalizer (DFE) comprising:

an adder including a first node and a second node, and the adder configured to:

receive an input signal, amplify a voltage difference between a reference voltage level and a voltage level of the input signal based on a DQ bias voltage, and output a first internal signal from the first node and a second internal signal from the second node;

a first DFE tap configured to provide a first tap bias current to one of the first node and the second node, based on a first sample signal corresponding to an immediately preceding bit of the input signal; and a tap bias voltage generation circuit configured to provide the first DFE tap with a first tap bias voltage corresponding to the first tap bias current, based on the DQ bias voltage, a tap code set in a training operation of the DFE, and a temperature code depending on a temperature of the DFE.

2. The DFE of claim 1, wherein the tap bias voltage generation circuit comprises:

a temperature calibration circuit comprising:

a plurality of input current paths configured to turn on or turn off based on the temperature code; and at least one default current path connected to a ground voltage and configured to continuously flow a current, wherein the temperature calibration circuit is configured to output a bias voltage based on the number of turned-on input current paths and the DQ bias voltage; and a calibration circuit comprising:

a plurality of output current paths configured to turn on or turn off based on the tap code, wherein the calibration circuit is configured to output the first tap bias voltage based on the bias voltage and the number of turned-on output current paths.

3. The DFE of claim 2, wherein the temperature calibration circuit further comprises:

an n-type metal oxide semiconductor (NMOS) transistor configured such that the DQ bias voltage is applied to a gate terminal of the NMOS transistor, a drain terminal of the NMOS transistor is connected in parallel to the plurality of input current paths and the at least one default current path, and a DQ bias current flows between the drain terminal and a source terminal of the NMOS transistor, wherein each of the plurality of input current paths comprises a p-type metal oxide semiconductor (PMOS) transistor configured such that the bias voltage is output through a gate terminal of the PMOS transistor, based on a magnitude of a current flowing between a drain terminal and a source terminal of the PMOS transistor, and wherein a magnitude of the DQ bias current is obtained by adding a total magnitude of the currents flowing through all turned-on input current paths and a magnitude of the current flowing through the at least one default current path.

4. The DFE of claim 2, wherein the calibration circuit further comprises:

an n-type metal oxide semiconductor (NMOS) transistor configured such that a drain terminal of the NMOS transistor is connected in parallel to the plurality of output current paths, a first tap bias current flows between the drain terminal and a source terminal of the NMOS transistor, and the first tap bias voltage is output through a gate terminal of the NMOS transistor, wherein each of the plurality of output current paths comprises a p-type metal oxide semiconductor (PMOS) transistor configured to provide a current flowing between a drain terminal and a source terminal of the PMOS transistor based on the bias voltage, and wherein a magnitude of the first tap bias current is equal to a total magnitude of the currents flowing through all turned-on output current paths.

5. The DFE of claim 2, wherein the temperature code is expressed as a unary code, and wherein the temperature calibration circuit is configured to turn on the plurality of input current paths as many as a number of 0s expressed in the temperature code.

6. The DFE of claim 5, wherein the temperature calibration circuit is configured such that the number of turned-on input current paths increases by 1 as a value of the temperature code decreases by 1.

7. The DFE of claim 1, wherein the adder further includes:

a first resistor connected between a power supply voltage and the second node, and a second resistor connected between the power supply voltage and the first node, wherein a change in a tap value of the first DFE tap depending on the temperature is the same as a change in gain of the adder depending on the temperature, and wherein the tap value is determined by multiplying a value of the first tap bias current by a resistance value of the first resistor or the second resistor.

8. A memory device comprising:

a decision feedback equalizer (DFE) configured to receive an input signal and output first and second internal signals, wherein the DFE comprises:

an adder including a first node and a second node, and the adder configured to:

receive the input signal, amplify a voltage difference between a reference voltage level and a voltage level of the input signal based on a DQ bias voltage, and output the first internal signal from the first node and the second internal signal from the second node;

a first DFE tap configured to provide a first tap bias current to one of the first node and the second node, based on a first sample signal corresponding to an immediately preceding bit of the input signal; and a tap bias voltage generation circuit configured to provide the first DFE tap with a first tap bias voltage corresponding to the first tap bias current, based on the DQ bias voltage, a tap code set in a training operation of the memory device, and a temperature code depending on a temperature of the memory device.

9. The memory device of claim 8, wherein the tap bias voltage generation circuit comprises:

a temperature calibration circuit comprising:

a plurality of input current paths configured to turn on or turn off based on the temperature code; and at least one default current path connected to a ground voltage and configured to continuously flow a current, wherein the temperature calibration circuit is configured to output a bias voltage based on the number of turned-on input current paths and the DQ bias voltage; and a calibration circuit comprising:

a plurality of output current paths configured to turn on or turn off based on the tap code, wherein the calibration circuit is configured to output the first tap bias voltage based on the bias voltage and the number of turned-on output current paths.

10. The memory device of claim 9, wherein the temperature calibration circuit further comprises:

an n-type metal oxide semiconductor (NMOS) transistor configured such that the DQ bias voltage is applied to a gate terminal of the NMOS transistor, a drain terminal of the NMOS transistor is connected in parallel to the plurality of input current paths and the at least one default current path, and a DQ bias current flows between the drain terminal and a source terminal of the NMOS transistor, wherein each of the plurality of input current paths comprises a p-type metal oxide semiconductor (PMOS) transistor configured such that the bias voltage is output through a gate terminal of the PMOS transistor, based on a magnitude of a current flowing between a drain terminal and a source terminal of the PMOS transistor, and wherein a magnitude of the DQ bias current is obtained by adding a total magnitude of the currents flowing through all turned-on input current paths and a magnitude of the current flowing through the at least one default current path.

11. The memory device of claim 9, wherein the calibration circuit further comprises:

an n-type metal oxide semiconductor (NMOS) transistor configured such that a drain terminal of the NMOS transistor is connected in parallel to the plurality of output current paths, a first tap bias current flows between the drain terminal and a source terminal of the NMOS transistor, and the first tap bias voltage is output through a gate terminal of the NMOS transistor, and wherein each of the plurality of output current paths comprises a p-type metal oxide semiconductor (PMOS) transistor configured to provide a current flowing between a drain terminal and a source terminal of the PMOS transistor based on the bias voltage, and wherein a magnitude of the first tap bias current is equal to a total magnitude of the currents flowing through all turned-on output current paths.

12. The memory device of claim 9, wherein the temperature code is expressed as a unary code, and wherein the temperature calibration circuit is configured to turn on the plurality of input current paths as many as the number of 0s expressed in the temperature code.

13. The memory device of claim 12, wherein the temperature calibration circuit is configured such that the number of turned-on input current paths increases by 1 as a value of the temperature code decreases by 1.

14. The memory device of claim 8, wherein the adder further includes:

a first resistor connected between a power supply voltage and the second node, and a second resistor connected between the power supply voltage and the first node, wherein a change in a tap value of the first DFE tap depending on the temperature is the same as a change in gain of the adder depending on the temperature, and wherein the tap value is determined by multiplying a value of the first tap bias current by a resistance value of the first resistor or the second resistor.

15. A memory system comprising:

a memory controller; and a memory device connected to the memory controller, wherein the memory device comprises a decision feedback equalizer (DFE), and wherein the DFE is configured to receive an input signal and output first and second internal signals, and the DFE comprises:

an adder including a first node and a second node, and the adder configured to:

receive the input signal, amplify a voltage difference between a reference voltage level and a voltage level of the input signal based on a DQ bias voltage, and output the first internal signal from the first node and the second internal signal from the second node;

a first DFE tap configured to provide a first tap bias current to one of the first node and the second node, based on a first sample signal corresponding to an immediately preceding bit of the input signal; and a tap bias voltage generation circuit configured to provide the first DFE tap with a first tap bias voltage corresponding to the first tap bias current, based on the DQ bias voltage, a tap code set in a training operation of the memory system, and a temperature code depending on a temperature of the memory system.

16. The memory system of claim 15, wherein the tap bias voltage generation circuit comprises:

a temperature calibration circuit comprising:

a plurality of input current paths configured to turn on or turn off based on the temperature code; and at least one default current path connected to a ground voltage and configured to continuously flow a current, wherein the temperature calibration circuit is configured to output a bias voltage based on the number of turned-on input current paths and the DQ bias voltage; and a calibration circuit comprising:

a plurality of output current paths configured to turn on or turn off based on the tap code, wherein the calibration circuit is configured to output the first tap bias voltage based on the bias voltage and the number of turned-on output current paths.

17. The memory system of claim 16, wherein the temperature calibration circuit further comprises:

an n-type metal oxide semiconductor (NMOS) transistor configured such that the DQ bias voltage is applied to a gate terminal of the NMOS transistor, a drain terminal of the NMOS transistor is connected in parallel to the plurality of input current paths and the at least one default current path, and a DQ bias current flows between the drain terminal and a source terminal of the NMOS transistor, wherein each of the plurality of input current paths comprises a p-type metal oxide semiconductor (PMOS) transistor configured such that the bias voltage is output through a gate terminal of the PMOS transistor, based on a magnitude of a current flowing between a drain terminal and a source terminal of the PMOS transistor, and wherein a magnitude of the DQ bias current is obtained by adding a total magnitude of the currents flowing through all turned-on input current paths and a magnitude of the current flowing through the at least one default current path.

18. The memory system of claim 16, wherein the calibration circuit further comprises:

an n-type metal oxide semiconductor (NMOS) transistor configured such that a drain terminal of the NMOS transistor is connected in parallel to the plurality of output current paths, a first tap bias current flows between the drain terminal and a source terminal of the NMOS transistor, and the first tap bias voltage is output through a gate terminal of the NMOS transistor, and wherein each of the plurality of output current paths comprises a p-type metal oxide semiconductor (PMOS) transistor configured to provide a current flowing between a drain terminal and a source terminal of the PMOS transistor based on the bias voltage, and wherein a magnitude of the first tap bias current is equal to a total magnitude of the currents flowing through all turned-on output current paths.

19. The memory system of claim 16, wherein the temperature code is expressed as a unary code, and wherein the temperature calibration circuit is configured to turn on the plurality of input current paths as many as a number of 0s expressed in the temperature code.

20. The memory system of claim 15, wherein the adder further includes:

a first resistor connected between a power supply voltage and the second node, and a second resistor connected between the power supply voltage and the first node, wherein a change in a tap value of the first DFE tap depending on the temperature is the same as a change in gain of the adder depending on the temperature, and wherein the tap value is determined by multiplying a value of the first tap bias current by a resistance value of the first resistor or the second resistor.

* * * * *